United States Patent [19]
Fathauer et al.

[11] Patent Number: 5,757,024
[45] Date of Patent: May 26, 1998

[54] BURIED POROUS SILICON-GERMANIUM LAYERS IN MONOCRYSTALLINE SILICON LATTICES

[75] Inventors: Robert W. Fathauer, Phoenix, Ariz.; Thomas George, La Crescenta; Eric W. Jones, Los Angeles, both of Calif.

[73] Assignee: The United States of America as represented by the Administrator of the National Aeronautics and Space Administration, Washington, D.C.

[21] Appl. No.: 695,322

[22] Filed: Jul. 10, 1996

Related U.S. Application Data

[62] Division of Ser. No. 390,456, Feb. 15, 1995, Pat. No. 5,685,946, which is a continuation of Ser. No. 105,728, Aug. 11, 1993, abandoned.

[51] Int. Cl.$^6$ .................................................. H01L 29/06
[52] U.S. Cl. .............................. 257/19; 257/15; 257/65; 257/103
[58] Field of Search .......................... 257/19.65, 14, 257/15, 103

[56] References Cited

U.S. PATENT DOCUMENTS

| | | | |
|---|---|---|---|
| 4,704,785 | 11/1987 | Curran | 437/110 |
| 4,849,370 | 7/1989 | Spratt et al. | 437/71 |
| 4,857,972 | 8/1989 | Jorke et al. | 357/4 |
| 4,861,393 | 8/1989 | Bean et al. | 148/334 |
| 4,891,329 | 1/1990 | Reisman et al. | 437/61 |
| 4,959,694 | 9/1990 | Gell | 357/16 |
| 4,975,387 | 12/1990 | Prokes et al. | 437/131 |
| 5,006,912 | 4/1991 | Smith et al. | 357/34 |
| 5,023,200 | 6/1991 | Blewer et al. | 437/187 |
| 5,057,022 | 10/1991 | Miller | 437/71 |
| 5,180,684 | 1/1993 | Fujioka | 437/110 |

OTHER PUBLICATIONS

S. Gardelis et al., Evidence for Quantum Confinement in the Photoluminescence of Porous Si and SiGe, Appl. Phys. Lett. 59, (17) 21 Oct. 1991, pp. 2118–2120.

A. H. Krist et al., Selective Removal of a Si0.7Ge0.3 Layer from Si(100), Appl. Phys. Lett. 58, (17), 29 Apr. 1991, pp. 1899–1901.

New Class of Si–Based Supperlattices: Alternating Layers of Crystalline Si and Porous Amorphous Si1–xGex Alloys, R.W. Fathauer et al., Appl. Phys. Lett. 61 (19), 9 Nov. 1992, pp. 2350–2352.

Visible Luminescence from Silicon Wafers Subjected to Stain Etches, R.W. Fathauer et al., Appl. Phys. Lett. 60 (8), 24 Feb. 1992, pp. 995–997.

Electronic Structure of Light Emitting Porous Silicon, R.P. Vasquez et al., Appl. Phys. Lett. 60 (8), 24 Feb. 1992, pp. 1004–1006.

Microstructural Investigation of Light Emitting Porous Silicon Layers, T. George et al., Appl. PHys. Lett. 60 (19), 11 May 1992, pp. 2359–2361.

Crystalline/Porous Amorphous Superlattice Formation by Etching of MBE Grown Si/SiGe Layers on Si Substrates, T. George et al., Materials Research Soc., 1992 Fall Meeting, 1 page abstract, with T. George, W. T. Pike, R. W. Fathauer, E. W. Jones and A Ksendzov, (Tu et al. Editors), "Single Crystalline/Porous Amorphous Superlattice Formation By the Etching of MBE Grown Si/Si1–xGex Layers on Si Substrates", Semiconductor Heterostructures for Photonic and Electronic Applications, Mat. Res. Soc. 1993, pp. 507–512, conference dated 30 Nov.–4 Dec. 1992.

*Primary Examiner*—Sara W. Crane
*Attorney, Agent, or Firm*—John H. Kusmiss

[57] ABSTRACT

Monocrystalline semiconductor lattices with a buried porous semiconductor layer having different chemical composition. Also monocrystalline semiconductor superlattices with a buried porous semiconductor layers having different chemical composition than that of its monocrystalline semiconductor superlattice. Lattices of alternating layers of monocrystalline silicon and porous silicon-germanium have been produced. These single crystal lattices have been fabricated by epitaxial growth of Si and Si-Ge layers followed by patterning into mesa structures. The mesa structures are stain etched resulting in porosification of the Si-Ge layers with a minor amount of porosification of the monocrystalline Si layers. Thicker Si-Ge layers produced in a similar manner emitted visible light at room temperature.

18 Claims, 3 Drawing Sheets

BURIED POROUS SILICON-GERMANIUM LAYERS IN MONOCRYSTALLINE SILICON LATTICES

RELATED U.S. APPLICATION

Division of Ser. No. 08/390,456 filed Feb. 15, 1995, now U.S. Pat. No. 5,685,946 which is a continuation of Ser. No. 08/105,728 filed Aug. 11, 1993 now abandoned.

ORIGIN OF INVENTION

The invention described herein was made in the performance of work under a NASA Contract, and is subject to the provisions of Public Law 96-517 (35 USC 202) in which the Contractor has elected not to retain title.

TECHNICAL FIELD

The invention relates to microelectronic and optoelectronic devices having superlattice components.

BACKGROUND OF THE INVENTION

Although silicon-based electronic devices and integrated circuits are in widespread use, their use in photonic applications have been for the most part unsuccessful. Observations of visible light-emissions in porous silicon layers at room temperature have stimulated research. Porous Si layers are generally produced by anodic etching of a single crystal Si substrates in HF solutions. U.S. Pat. No. 5,023,200 describes an anodic method of forming porous Si layers in a lattice.

The incorporation of light-emitting porous Si in electroluminescent devices has sometimes used metal contacts directly on the porous silicon. Such contacting is very ineffective and such devices have very limited usefulness.

Much effort has been expended in attempting to produce electroluminescence from Group IV materials. One approach, which to date has been largely unsuccessful, has been to produce a quasi-direct band gap by Brillouin zone folding in epitaxially grown silicon/silicon-germanium superlattices.

Others have reported the complete removal of a 50 nm thick alloy layer of a $Si/Si_{0.7}Ge_{0.3}$ structure using $HF:HNO_3:H_2O$ having a 5:40:30 composition; however, the rate of dissolution of the alloy layer was only 13 times that of the Si substrate.

Examples of some Si and Si-Ge containing devices are found in U.S. Pat. Nos.:

| | |
|---|---|
| 5,180,684 | 4,959,694 |
| 5,057,022 | 4,891,329 |
| 5,006,912 | 4,857,972 |
| 4,975,387 | 4,704,785 |

Other silicon based superlattices and multilayer structures which have been investigated include $Si/Si_{1-x}C_x$ and $Si/CoSi_2$; however, due to dissimilarities in crystal structure and surface energies, the crystalline quality has been relatively poor. Unfortunately, no Si based superlattices have been found in the art which exhibited exciting new properties, based on wave function overlap.

There is a need for Si based lattices having embedded porous Si layers with good electrical contact for use in Si based devices such as resonant-tunneling diodes, modulation-doped field-effect transistors, and quantum-well infrared photodetectors. Such lattices are would also be useful in lift-off technology with separation through the porous Si layer with the Si layer intact for subsequent deposit on compound semiconductor substrates.

ABBREVIATIONS

The following abbreviations are used herein.

| CBD | convergent-beam diffraction |
|---|---|
| MBE | molecular beam epitaxy |
| PL | photoluminescence |
| TEM | transmission electron microscopy |
| XPS | X-ray photoelectron spectroscopy |

SUMMARY OF THE INVENTION

There is provided by the principles of this invention a monocrystalline semiconductor first element-containing lattice having an embedded porous semiconductor second element-containing layer. The second monocrystalline semiconductor first element-containing layer is epitaxially oriented with respect to the first monocrystalline semiconductor first element-containing layer. Embedded between the monocrystalline semiconductor first element-containing layers is a thin porous semiconductor second element-containing layer having pores throughout and which is atomically different than the monocrystalline semiconductor first element-containing layers. The monocrystalline semiconductor first element-containing layers have no more than a non-deleterious amount of porosification and have a high crystalline quality.

In one embodiment, the atomical composition of the second monocrystalline semiconductor first element-containing layer is the same as atomical composition of the first monocrystalline semiconductor first element-containing layer.

In another embodiment, the amount of the first element is at least about 0.4 atomically, and wherein the amount of the second element is at least about 0.1 atomically. In still another embodiment, the lattice layers have thicknesses less than 1 μm.

In a further embodiment, the lattice comprises multiple alternating layers of monocrystalline semiconductor first element-containing layers and thin porous semiconductor second element-containing layers. Each of the porous semiconductor second element-containing layers are atomically different than each of the monocrystalline semiconductor first element-containing layers, and the monocrystalline semiconductor first element-containing layers are mutually epitaxially oriented.

With regard to Si based materials, the ability to synthesize Si based materials with new optical, photonic and electronic properties is greatly desired. Unfortunately, despite considerable effort, Si based superlattices and quantum wells demonstrated in the art have exhibited limited new properties. In this invention novel superlattices comprising alternating layers of monocrystalline Si and porous Si-Ge have been fabricated. This invention is directed towards a lattice having monocrystalline Si layers with embedded porous Si-Ge layers. The Si layer can be on a Si substrate or wafer. The product of this invention can have a single layer or multiple layer of porous Si-Ge. This invention also includes a method for producing such products.

The method is carried out by growing epitaxially Si and Si-Ge layers, followed by patterning or contouring to fabricate a structure which will facilitate wet-chemical solution penetration into the Si-Ge layers.

MBE was used for layer growth, however, other epitaxial techniques will work also. The patterning of the epitaxially grown layers was carried out in one embodiment of this invention by photolithography and plasma etch in $CF_4$; however, other patterning techniques will also work. In one embodiment the patterning was carried out by argon milling to form mesa structures.

After patterning mesa structures on the epitaxially formed layers, the layers are stain etched with an etchant. The stain etching is conducted under conditions operable for forming a high density of small pores in the Si-Ge layers with no more than a minor amount of porosification of the Si layers. By minor amount of porosification of the Si layers as used herein is meant a non-deleterious amount of porosification which allows for some pores at the perimeter or interface with the Si-Ge layers or surface of the Si layers, but no overall porosity throughout the Si layers. For example we have found that using stain etching under the conditions of this invention, the penetration of the Si-Ge layers is at least about 100 times that of the Si layers which enables total porosification of the SiGe alloy layers and no more than a non-detrimental amount of porosification of the Si layers.

Because of the preferential etching possible by the process of this invention porosification of the monocrystalline Si-Ge layers was achieved in thin 5 to 20 nm SiGe layers between 30 nm Si layers with no detrimental porosification of the Si layers. The stain etching also produced Ge rich porous layers.

We have found that the degree of selectivity is a function of the Si-Ge layer strain and thickness. The SiGe layers produced were found to be porous and structurally stable at annealing temperatures as high as 1100° C.

Accordingly, there is provided by the principles of this invention a monocrystalline silicon lattice having a high crystalline quality and having an embedded porous germanium-containing layer. The lattice comprises a first monocrystalline silicon-containing layer; a second monocrystalline silicon-containing layer epitaxially oriented with respect to the first monocrystalline silicon-containing layer; and embedded between the monocrystalline silicon-containing layers, a thin porous germanium-containing layer having pores throughout. The structures of this invention include multilayer lattices and superlattices. The monocrystalline silicon-containing layers have a high crystalline quality and no more than a non-deleterious or minor amount of porosification at the interface and surface of the silicon-containing layers as determined by TEM imaging.

In one embodiment of this invention the superlattice has layers with thicknesses less than 1 μm. In another embodiment of this invention the superlattice has monocrystalline silicon-containing layers with thicknesses no greater than about 200 nm with buried porous germanium-containing layers with thicknesses no greater than about 20 nm.

There is also provided by the principles of this invention a process for forming a monocrystalline semiconductor first element-containing lattice having a high crystalline quality and having an embedded porous semiconductor second element-containing layer. The process comprises epitaxially forming a thin monocrystalline semiconductor-alloy layer of an alloy composition having a substantial amount of a first element and a second element, on a first monocrystalline semiconductor layer of a first composition having a substantial amount of the first element. An element present in about 10% atomically or more is considered a substantial amount. The alloy composition, however, is atomically different than the first composition. The process further comprises epitaxially forming a second monocrystalline semiconductor layer of the first composition on the monocrystalline semiconductor-alloy layer, thereby forming a sandwich structure comprising: first composition/alloy composition/first composition.

Epitaxial growth can be by solid source MBE, gas source MBE, chemical vapor deposition ("CVD"), limited reaction processing CVD, or photo epitaxial growth.

The process also comprises patterning the epitaxially formed monocrystalline semiconductor-alloy layer into mesa structures, and transforming the monocrystalline semiconductor-alloy layer by etching for a period of time and under conditions with an etchant operable for total porosification of the semiconductor-alloy layer but inoperable for porosification of more than a non-deleterious amount of the monocrystalline semiconductor layers of the first composition, into a monocrystalline semiconductor first element-containing lattice having a high crystalline quality and having an embedded porous second element-containing layer.

Patterning can also be performed by wet chemical etching.

In one embodiment the process further comprises controlling the epitaxially forming of the monocrystalline semiconductor-alloy layer to produce a predetermined thickness which is operable for minimizing strain relief in the semiconductor-alloy layer during the etching step, thereby enabling the porosification of the layer to proceed at a rate greater than the rate of porosification of the monocrystalline semiconductor layers of the first composition.

In a still further embodiment the etchant is an etching solution, and the process further comprises controlling the predetermined thickness during epitaxial growth to produce a monocrystalline semiconductor-alloy layer thickness operable for permitting the etching solution to penetrate the entire monocrystalline semiconductor-alloy layer or layers.

In another embodiment of this invention the first element is selected from the group consisting of C, Ge, Sn, Si, and mixtures thereof. In a further embodiment the second element is also selected from the group consisting of C, Ge, Sn, Si, and mixtures thereof, provided, however, that the alloy composition is atomically different than the first composition.

In one embodiment of this invention the epitaxially forming of the monocrystalline semiconductor-alloy layer and the monocrystalline semiconductor layer of the first composition is repeated to form a superlattice comprising multiple alternating layers of alloy composition/first composition, which are then patterned and transformed in a similar manner as described.

There is also provided by the principals of this invention a process for forming a monocrystalline silicon-containing lattice having a high crystalline quality and having an embedded porous germanium-containing layer. The process comprises epitaxially forming a thin monocrystalline silicon-germanium layer on a first monocrystalline silicon-containing layer and then epitaxially forming a second monocrystalline silicon layer on the monocrystalline silicon-germanium layer.

The process further comprises patterning the epitaxially formed monocrystalline silicon-germanium layer into mesa structures. Thereafter, the monocrystalline silicon-germanium layer is transformed by etching over a period of time and under conditions with an etchant operable for total porosification of the silicon-germanium layer but inoperable for porosification of more than a non-deleterious amount of the monocrystalline silicon-containing layers, into a monocrystalline silicon-containing lattice having a high crystalline quality and having an embedded porous germanium-containing layer.

In a further embodiment of this invention the process also comprises controlling the epitaxial growth of the monocrystalline silicon-germanium layer to produce a predetermined thickness which is operable for minimizing strain relief in the silicon-germanium layer during the etching step, which, we have found, enables the porosification thereof to proceed at a rate greater than the rate of porosification of the silicon-containing layers. In a still further embodiment wherein the etchant is an etching solution, the process also comprises controlling the predetermined thickness to produce a layer thickness operable for permitting the etching solution to penetrate the entire monocrystalline silicon-germanium layer.

In another embodiment the epitaxially forming of the monocrystalline silicon-germanium layer is conducted over a period of time operable for growing the layer to a thickness of from about 3 nm to about 100 nm, and, in another embodiment, the period of time is operable for growth to a thickness of from about 5 to about 20 nm.

In still another embodiment the epitaxially forming of the monocrystalline silicon-germanium layer is conducted at a temperature of from about 400° to about 650° C.

In yet another embodiment the epitaxially forming of the monocrystalline silicon-germanium layer includes adjusting the relative amounts of silicon and germanium so that the layer stoichiometrically has the composition $Si_{1-x}Ge_x$, where x is from about 0.1 to about 0.6. In one embodiment x is about 0.3.

In another embodiment the epitaxially forming of a monocrystalline silicon-germanium layer includes dispersing during or after growth a p-type dopant in the layer.

In one embodiment of this invention the epitaxially forming of the monocrystalline silicon-containing layer is conducted over a period of time operable for growth of the layer to a thickness of from about 5 nm to about 200 nm. In another embodiment the layer is grown to a thickness of from about 20 nm to about 30 nm.

In one embodiment the first monocrystalline silicon-containing layer is a monocrystalline silicon substrate or wafer.

In another embodiment the epitaxially forming of the monocrystalline silicon-germanium and monocrystalline silicon-containing layers is conducted at a temperature of from about 300° to about 700° C.

In one embodiment of this invention the patterning of epitaxially formed monocrystalline silicon-germanium layer into mesa structures is by argon milling using an aluminum mask followed by stripping the aluminum mask. In a further embodiment stripping is by contacting the aluminum mask with a phosphoric acid solution.

In another embodiment the patterning forms mesa structures having a width of from about 0.1 μm to about 10 μm, and, in one embodiment the width is about 1 μm.

In still another embodiment the patterning is by plasma etching.

In one embodiment of this invention the period of time for transformation of the silicon-germanium layer is operable for removing an amount of silicon so that the germanium content of the embedded porous germanium-containing layer is from about 50 to about 100% atomically. In another embodiment the period of time is operable for causing the germanium content to be at least about 90% atomically.

In another embodiment the etchant is selected from the group consisting of $HF:HNO_3:H_2O$, $HF:NaNO_3:H_2O$, $HF:HNO_3$, $HF:HNO_3:CH_3COOH$, and $HF:HNO_3:CH_3COOH:H_2O$. In one further embodiment the etching solution is $HF:HNO_3:H_2O$ having a concentration of about 4:1:4 by volume, and in another the concentration is about 4:1:6 by volume. In either of these embodiments, the HF is about 49% by weight, the $HNO_3$ is about 70% by weight, and the etching is conducted from about 10 sec. to about 1 min.

In still another embodiment the transforming of the monocrystalline silicon-germanium layer is conducted in the absence of anodic etching.

In yet another embodiment the layers are formed by epitaxial growth into an unitary structure without the need for other bonding steps such as thermal bonding and fusion techniques at elevated temperatures and pressures in a steam environment.

In one embodiment of this invention the epitaxially forming of the monocrystalline silicon-germanium layer and the monocrystalline silicon-containing layer is repeated to form a superlattice comprising multiple alternating layers of alloy composition/silicon-containing composition which are then patterned and transformed in a similar manner as described. Accordingly, in one embodiment the process further comprises repeating the steps for epitaxially forming another monocrystalline silicon-germanium layer and another monocrystalline silicon-containing layer to form from about 2 to about 50 pairs of monocrystalline silicon-germanium and monocrystalline silicon-containing layers.

This invention also includes the lattices and superlattices produced by the processes of this invention as described herein.

DESCRIPTION OF THE PREFERRED EMBODIMENTS

Figure 2:
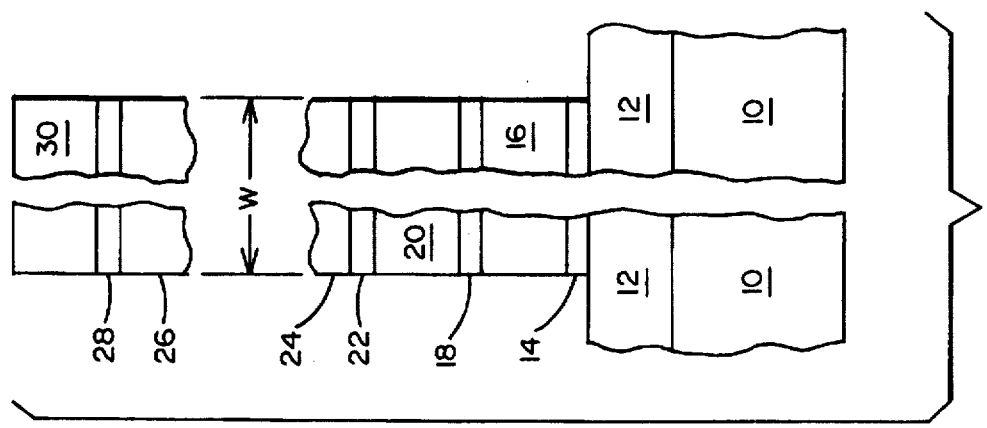
FIG. 2 is a schematic diagram of a stage of fabrication after that shown in FIG. 1 and after patterning.
Figure 1:
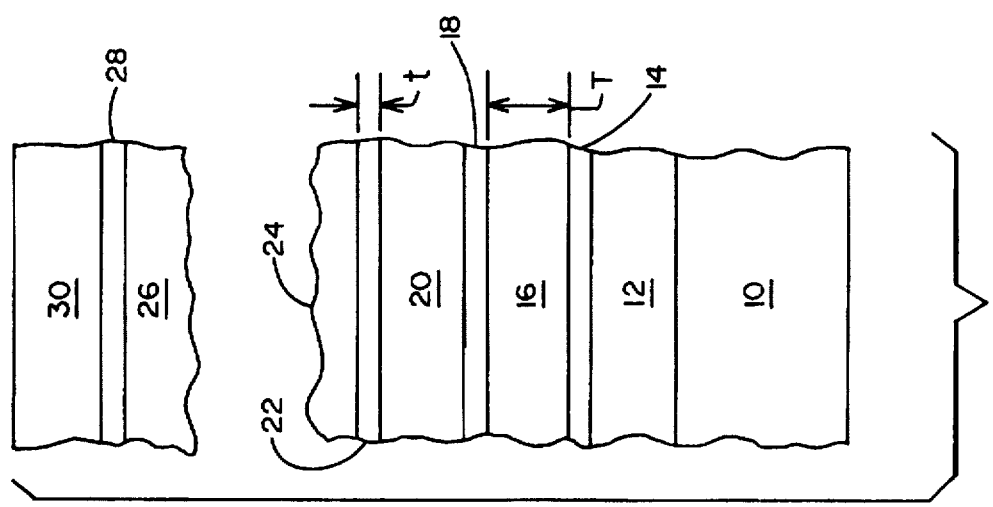
FIG. 1 is a schematic diagram of a greatly enlarged section of an early stage of fabrication of a superlattice after layer formation.

FIGS. 1 and 2 represents schematic diagrams of early stages in the formation of one embodiment of a superlattice of this invention. In FIG. 1 monocrystalline Si wafer 10 is used as a substrate for epitaxially forming monocrystalline Si layer 12.

Layer 12 in turn is used as a base for epitaxially forming monocrystalline Si-Ge layer 14. Layer 14 in turn is used as a base for epitaxially forming monocrystalline Si layer 16. Layer 16 in turn is used as a base for epitaxially forming monocrystalline Si-Ge layer 18. Layer 18 in turn is used as a base for epitaxially forming monocrystalline Si layer 20. Layer 20 in turn is used as a base for epitaxially forming monocrystalline Si-Ge layer 22. Layer 22 in turn is used as a base for epitaxially forming monocrystalline Si layer 24.

The epitaxial growth of alternate layers of Si and Si-Ge is continued until the desired number of pairs of Si-Ge and Si are formed as shown by Si layer 26, final SiGe layer 28, and final Si layer 30. In this embodiment the Si layers and the SiGe layers are grown to a predetermined thickness of "T" and "t", respectively. However, the structure can have varying thicknesses of the layers if desired.

After all desired layers of Si and SiGe are formed, the epitaxially formed layers down to at least first SiGe layer 14 are patterned by forming mesa structures having a predetermined nominal width "W" as shown in FIG. 2.

Figure 3:
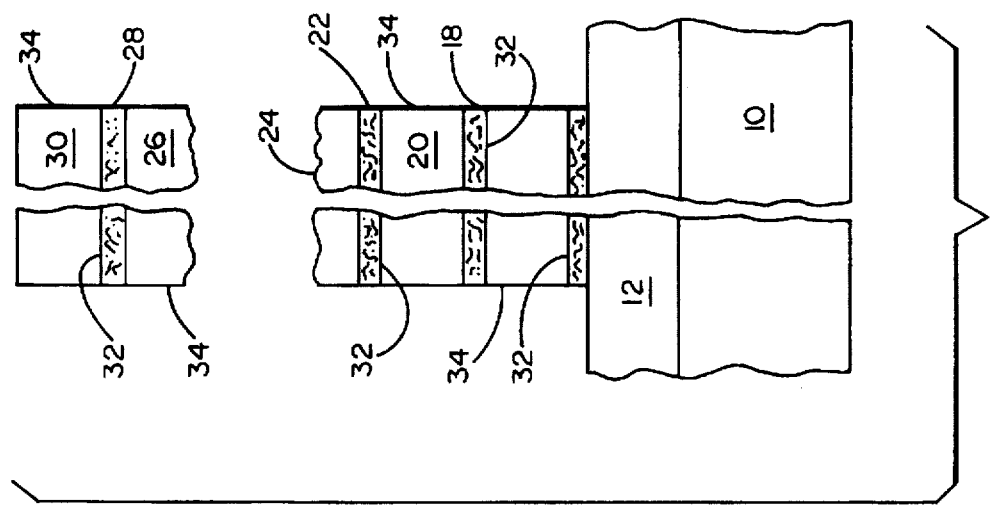
FIG. 3 is a schematic diagram of a still later stage of fabrication after that shown in FIG. 2 and after porosification.

Thereafter the SiGe layers are stain etched to form embedded porous Si-Ge containing layers 14, 18, 22 and 28 as shown in FIG. 3. During stain etching a minor amount of porosification of the Si layers may occur at Si-SiGe interfaces 32 and at Si surfaces 34.

EXAMPLES

A pseudomorphic Si/Si$_{0.7}$Ge$_{0.3}$ superlattice was grown by MBE, followed by Ar-ion milling to form mesa structures, and then by immersion in etchant solution #1 to porosify the SiGe layers. Etchant solution #1 consisted of HF:HNO$_3$:H$_2$O having a concentration of 4:1:4 by volume, wherein the HF is 49% by weight, and HNO$_3$ is 70% by weight. The stain etching was conducted for about 10 sec.

A high selectivity for etching the SiGe alloy layers relative to Si layers was observed, which resulted in lateral penetration of the pores to a depth of about 0.7 μm in SiGe layers and unetched Si layers. The selectivity was at least about 100:1 meaning that the lateral penetration of the etchant, and pore formation, in the SiGe layers was 100 times more than in the Si layers.

Figure 4:
FIG. 4 is a TEM image of a section of superlattice represented by FIG. 3.
Figure 5:
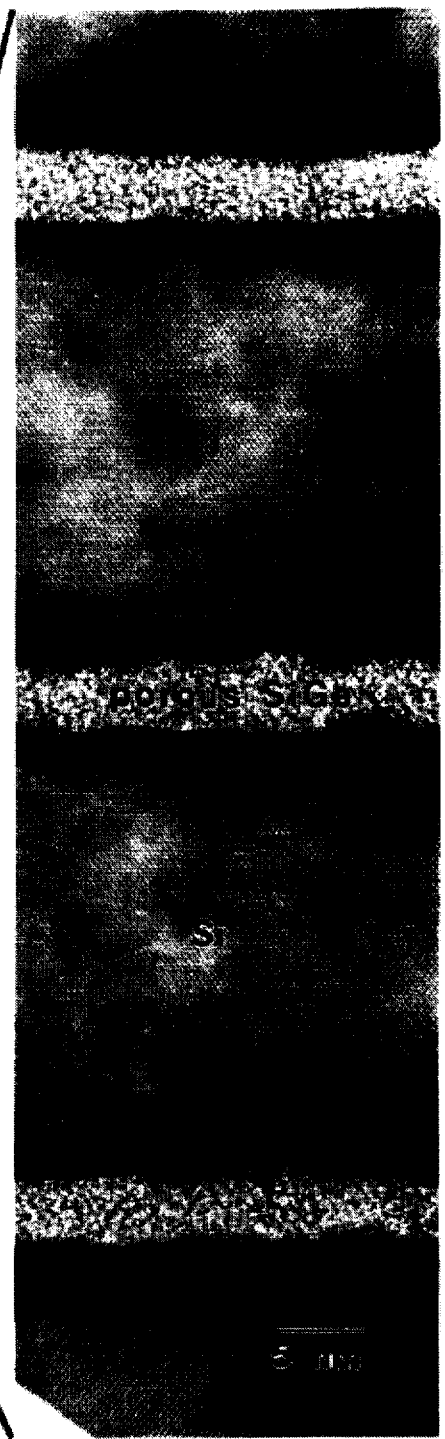
FIG. 5 is a higher magnification of a portion of the TEM image of FIG. 4.

Superlattices were fabricated from 1 μm wide mesas with ten 5 nm thick alloy layers, which when stain etched according to this invention was found upon analysis to be fully converted to porous layers having a thickness of about 6 nm. High-resolution cross-sectional TEM of a superlattice consisting of alternating layers of Si and porous SiGe prepared by this method is shown in the TEM image photographs of FIGS. 4 and 5. FIG. 5 is a higher magnification of a section shown in FIG. 4. The amorphous character of the porous alloy layers is indicated by the lack of periodicity in the lattice spots. For the TEM imaging, the samples were prepared by mechanical dimpling followed by Ar ion thinning.

Oxidation of SiGe layers results in the formation of SiO$_2$ with Ge enrichment at the interface with the oxide. Examination of thick 750 nm layers etched in a similar manner showed that the composition of the porous Si/SiGe layers was significantly richer in Ge than the dense unetched alloy. XPS data showed that the material remaining after etching was more than 90% Ge, which demonstrated that Si was removed during the controlled etching of this process. It was clear that the selectivity of the etch was a function of the strain effected by the lattice mismatch between Si and SiGe layers. This was evidenced by the extent of pore penetration in various layers, with lesser penetration seen in layers where strain relief during etching was able to occur to a greater extent. The combination of strain and enhanced Si oxidation in the presence of Ge accounted for the high selectivity observed.

For example, a sample was examined with varying SiGe layer thicknesses. The penetration depth in a 20 nm thick layer was found to be several times that in the 1 or 2.5 nm thick layers. This is attributed to the difficulty of transporting reactants through a very thin channel.

In another test, samples were grown on two inch diameter 1–3 Ω-cm n-type (100)-oriented Si wafers. The wafers were chemically cleaned ex situ, leaving a protective oxide which was removed with an HF-ethanol solution in a dry-nitrogen glove box on the same day as MBE growth. A Riber EVA 320 MBE system was used for lattice growth and Si and Ge were evaporated from separate electron-beam sources. Buffer layers of Si 50 nm thick were grown on the Si substrates prior to growth of Si/SiGe superlattices. Two structures were examined, the first superlattice having 10 pairs or periods of 30 nm thick Si and 5 nm thick alloy layers. The second superlattice had several pairs or periods of 50 nm thick Si and alloy layers having varying thicknesses of 1, 2.5, 20 and 50 nm. Both structures were below the critical thickness for introduction of misfit dislocations, so that all of the SiGe layers were pseudomorphically strained, which was verified by the lack of misfit dislocations in an ABT 002B TEM. The SiGe composition was verified by determining the strain tensor of one of the alloy layers using CBD in the TEM.

After removal from the MBE system, 1 μm tall mesa structures were etched by Ar ion milling using Al as a milling mask. The Al layer was first patterned into a series of lines of varying width; see FIG. 2, width "W". After milling, the Al was stripped and the wafers were immersed in HF:HNO$_3$:H$_2$O etchant solution #1 for 45 sec. TEM specimens were then prepared by conventional techniques, with the cross section cut perpendicular to the series of lines.

A single thick 200 nm alloy layer was also grown on a separate wafer and immersed in etchant solution #1. XPS and PL measurements were carried out on this sample.

Examination of the samples after stain etching revealed that the conversion to porous material occurred to a much greater lateral extent in the alloy layers than in the Si layers. In fact it was observed that the alloy layers were made porous all the way through the narrowest mesas. The porous alloy layers were not appreciably wider than the original unetched 5 nm thick alloy layers. The lateral extent of the porous channels was seen by TEM image to vary with the position in the superlattice. The amorphous character of the porous layers was seen in TEM images and by CBD patterns of such areas.

In the second sample having the varying alloy layer thicknesses, the lateral extent of the porous channel was seen by TEM image to vary with alloy layer thickness. The 20 nm thick layers etched further than the 1, 2.5 or 50 nm thick layers and this was observed in all mesas examined. Unlike the 5 nm thick porous alloy layers, the porous alloy layers formed from the 1 and 2.5 nm thick layers were wider than their original unetched layers. After etching the 1 nm alloy layer was increased to 4 nm.

A sample with a single 200 nm thick alloy layer was stain etched in a similar manner. XPS examination showed that the Ge content was increased to 96%.

Variation in lateral extent of etching with position in the superlattice also showed that etch selectivity was a function of strain. As each alloy layer was etched localized strain relief occurred due to the sponge-like character of the porous structure. The extent of strain relief at the top and bottom of the superlattice was limited due to the 100 nm thick Si regions maintaining the bulk-Si lattice parameter at the ends. As a result, the strain energy stored in the alloy layers decreased more in layers closer to the center of the superlattice. The smaller extent of pore formation in the center of the superlattice again confirmed that strain energy enhances the etch selectivity.

Similarly, in the sample with varying alloy layer thicknesses, the relatively thin Si cap on the surface allows the top 50 nm thick alloy layer to relax more than the 20 nm thick layer which was strongly coupled to the substrate thereby reducing etch selectivity in the thicker alloy layers. However, the reduced penetration in the thin 1 and 2.4 nm thick alloy layers was due to slower mass transport of reactants through the relatively narrow channels. The extent of the lateral etching is therefore decreased by strain relaxation in the thicker alloy layers and decreased by a slower rate of mass transport of reactants to the thinner alloy layers. However, control of the thickness of the alloy layers to a predetermined range as provide by this invention enables the alloy layers to be completely porosified while controlling porosification of the Si layers so that only a minor amount occurs at the Si/SiGe interfaces and the Si surfaces exposed at the mesa structures.

In one set of samples having 5 nm thick $Si_{1-x}Ge_x$ alloy layers spaced by 100 nm thick Si layers, the Ge content was varied from 0.2 to 0.6. Mesa structures patterning and etching were performed in a similar manner as in the earlier examples. Lateral penetration was found to increase with increasing value of x.

750 nm thick alloy layers with varying Ge content were also examined. For layers above the critical thickness for introduction of misfit dislocations, pores were seen by TEM imaging to penetrate much further into the layer at threading dislocations.

The etchant reactivity and period of time of etching provided by this invention further enable formation of superlattices having embedded porous silicon-germanium containing layers with only a minor amount of porosification of the Si layers.

The electrical and optical properties of the superlattice of this invention have not been fully explored; however, because such properties are generally quite different from crystalline Si, superlattices with interesting properties may be produced. For example, these lattices can result in improved control of current injection into high porosity material over that of simple metallic contacts used in electroluminescent porous Si structures or thick porous layers used in other known sandwich structures. By diffusing gaseous reactants through the pores of the lattices it is possible to convert the alloy layers to oxides, nitrides, metallic material and other compositions thereby producing additional useful structures.

Figure 6:
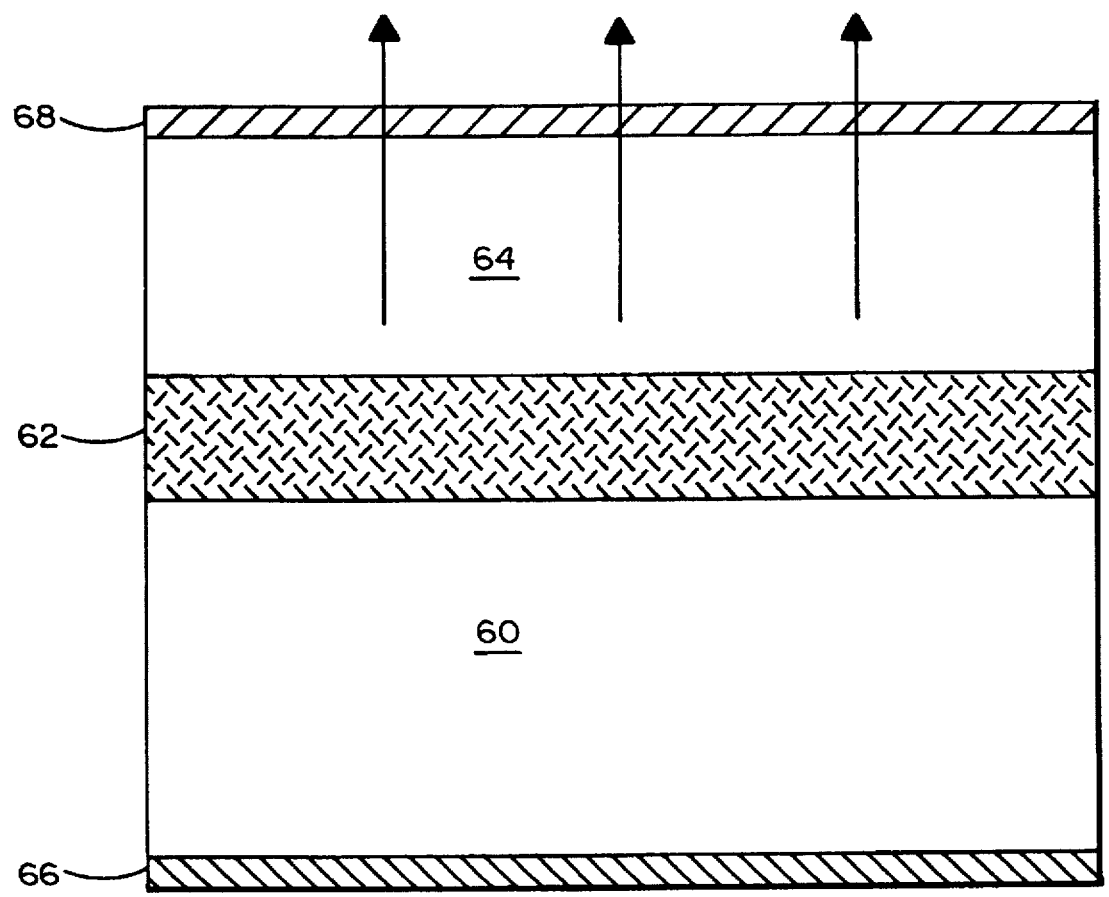
FIG. 6 is a schematic diagram of an electroluminescent diode structure.

Another application of the lattices of this invention is in the fabrication of an electroluminescent Si-based diode. This structure, as shown schematically in FIG. 6, could be fabricated with n-type Si substrate 60, with epitaxially formed SiGe layer 62, and epitaxially formed p-type Si layer 64. The SiGe layer could then be converted to light-emitting porous material by the process of this invention, and further processing carried out to fabricate a diode structure with a deposited metallic backside contact 66 and transparent conductive contact 68. When voltage is applied across contacts 66 and 68, current flows vertically through porous SiGe layer 62, resulting in photon emission. The photons pass through top contact 68, which is designed to be both conductive and optically transparent. Contact 68 can be lead-tin-oxide or heavily doped Si.

While the preferred embodiments of the present invention have been described, it should be understood that various changes, adaptations and modifications may be made thereto without departing from the spirit of the invention and the scope of the appended claims. It should be understood, therefore, that the invention is not to be limited to minor details of the illustrated invention shown in preferred embodiment and the figures, and that variations in such minor details will be apparent to one skilled in the art.

Therefore it is to be understood that the present disclosure and embodiments of this invention described herein are for purposes of illustration and example and that modifications and improvements may be made thereto without departing from the spirit of the invention or from the scope of the claims. The claims, therefore, are to be accorded a range of equivalents commensurate in scope with the advances made over the art.

What is claimed is:

1. A monocrystalline silicon lattice having a high crystalline quality and having an embedded porous germanium-containing layer comprising:
   a first monocrystalline silicon layer;
   a second monocrystalline silicon layer epitaxially oriented with respect to the first monocrystalline silicon layer; and
   embedded between the monocrystalline silicon layers, a thin porous germanium-containing layer having pores throughout, and
   wherein the monocrystalline silicon layers have no more than a non-deleterious amount of porosification and have a high crystalline quality; and
   further comprising multiple alternating layers of monocrystalline silicon layers and thin porous germanium-containing layers,
   wherein each of the porous germanium-containing layers are atomically different than each of the monocrystalline silicon layers, and
   wherein the monocrystalline semiconductor silicon layers are mutually epitaxially oriented.

2. The lattice of claim 1, wherein the very first monocrystalline silicon layer is a monocrystalline silicon substrate.

3. The lattice of claim 1, wherein atomical compositions of the monocrystalline semiconductor silicon layers are the same.

4. The lattice of claim 1, wherein atomical compositions of the monocrystalline semiconductor germanium-containing layers are the same.

5. The lattice of claim 1, wherein atomical compositions of the monocrystalline semiconductor silicon layers are the same, and wherein atomical compositions of the monocrystalline semiconductor second germanium-containing layers are the same.

6. The lattice of claim 1, wherein the germanium contents of the embedded porous germanium-containing layers are from about 50 to about 100% atomically.

7. The lattice of claim 1, wherein the germanium contents of the embedded porous germanium-containing layers are at least about 90% atomically.

8. The lattice of claim 1, wherein the germanium contents of the monocrystalline semiconductor germanium-containing layers are about 96% as determined by X-ray photoelectron spectroscopy examination.

9. The lattice of claim 1, wherein the monocrystalline silicon-containing layers have thicknesses no greater than about 200 nm.

10. The lattice of claim 1, wherein the buried porous germanium-containing layers have thicknesses no greater than about 20 nm.

11. The lattice of claim 1, wherein the monocrystalline silicon-containing layers have thicknesses no greater than about 200 nm, and wherein the buried porous germanium-containing layers have thicknesses no greater than about 20 nm.

12. A superlattice having a number of pairs of a monocrystalline silicon lattice, wherein the number of pairs is from about 2 to about 50, each monocrystalline silicon lattice having a high crystalline quality and having an embedded porous germanium-containing layer, each monocrystalline silicon lattice comprising:

a first monocrystalline silicon layer;

a second monocrystalline silicon layer epitaxially oriented with respect to the first monocrystalline silicon layer; and embedded between the monocrystalline silicon layers, a thin porous germanium-containing layer having pores throughout, wherein the monocrystalline silicon layers have no more than a non-deleterious amount of porosification and have a high crystalline quality.

13. The superlattice of claim 12, wherein atomical compositions of the monocrystalline semiconductor silicon layers are the same, and wherein atomical compositions of the monocrystalline semiconductor second germanium-containing layers are the same.

14. The superlattice of claim 12, wherein the germanium contents of the embedded porous germanium-containing layers are from about 50 to about 100% atomically.

15. The lattice of claim 12, wherein the monocrystalline silicon-containing layers have thicknesses no greater than about 200 nm.

16. The lattice of claim 12, wherein the buried porous germanium-containing layers have thicknesses no greater than about 20 nm.

17. The lattice of claim 12, wherein the monocrystalline silicon-containing layers have thicknesses no greater than about 200 nm, and wherein the buried porous germanium-containing layers have thicknesses no greater than about 20 nm.

18. The lattice of claim 12, wherein all of the monocrystalline silicon-containing layers are mutually epitaxially oriented.

* * * * *